United States Patent
Jeong et al.

(10) Patent No.: US 12,406,873 B2
(45) Date of Patent: Sep. 2, 2025

(54) LIFT PIN ASSEMBLY

(71) Applicant: ASM IP Holding B.V., Almere (NL)

(72) Inventors: Wonki Jeong, Cheonan-si (KR);
DaeYoun Kim, Daejeon (KR);
DongJun Park, Siheung-si (KR)

(73) Assignee: ASM IP Holding B.V., Almere (NL)

( * ) Notice: Subject to any disclaimer, the term of this patent is extended or adjusted under 35 U.S.C. 154(b) by 375 days.

(21) Appl. No.: 18/078,229

(22) Filed: Dec. 9, 2022

(65) Prior Publication Data

US 2023/0187260 A1 Jun. 15, 2023

Related U.S. Application Data

(60) Provisional application No. 63/289,377, filed on Dec. 14, 2021.

(51) Int. Cl.
*H01L 21/687* (2006.01)

(52) U.S. Cl.
CPC .. *H01L 21/68742* (2013.01); *H01L 21/68757* (2013.01); *H01L 21/68785* (2013.01)

(58) Field of Classification Search
CPC ......... H01L 21/68742; H01L 21/68764; H01L 21/68771; H01L 21/6875
USPC ....................... 269/269 R, 903, 21
See application file for complete search history.

(56) References Cited

U.S. PATENT DOCUMENTS

| | | | |
|---|---|---|---|
| 6,958,098 B2 | 10/2005 | Gujer | |
| 7,204,888 B2 | 4/2007 | Tran | |
| D568,914 S * | 5/2008 | Or | D15/138 |
| 8,097,543 B2 * | 1/2012 | Koelmel | H01L 21/67248 257/E21.328 |
| 9,120,114 B2 * | 9/2015 | Jeong | C23C 16/4583 |
| 10,431,488 B2 | 10/2019 | Yoon | |
| 10,784,142 B2 | 9/2020 | Marcelynas | |
| 11,282,738 B2 * | 3/2022 | Kim | H01L 21/68742 |
| 11,651,990 B2 * | 5/2023 | Han | H01L 21/68785 414/416.11 |
| 2003/0075387 A1 * | 4/2003 | Wang | C23C 14/50 187/250 |
| 2004/0219006 A1 * | 11/2004 | Tran | H01L 21/68742 414/217 |
| 2006/0156987 A1 * | 7/2006 | Lai | H01L 21/68742 118/728 |
| 2007/0089672 A1 * | 4/2007 | Shimamura | C23C 16/4586 204/192.12 |
| 2009/0175606 A1 * | 7/2009 | Bezama | H01L 21/67103 438/795 |

(Continued)

*Primary Examiner* — Jason L Vaughan
(74) *Attorney, Agent, or Firm* — Snell & Wilmer L.L.P.

(57) ABSTRACT

In one embodiment according to the disclosure, an apparatus for manipulating substrates in semiconductor processing comprising a plurality of lift pins, comprising a top end and a down end, and configured for the top end can move upward to an UP position and move downward to a DOWN position, wherein the top end supports a wafer, a weight comprising a plurality of lift pin holes and is configured to connect the plurality of lift pins and a plurality of weight supports, each of them are configured to attach to the plurality of lift pins respectively and each of them are to be placed in the plurality of lift pin holes respectively is presented. The embodiment can improve the semiconductor processing efficiency by preventing the lift pins from getting stuck.

17 Claims, 5 Drawing Sheets

(56) References Cited

U.S. PATENT DOCUMENTS

2009/0314211 A1* 12/2009 Du Bois ........... H01L 21/68742
                                                        118/729
2019/0355612 A1    11/2019 Sakurai
2021/0005504 A1*   1/2021 Han ................. H01L 21/68785

* cited by examiner

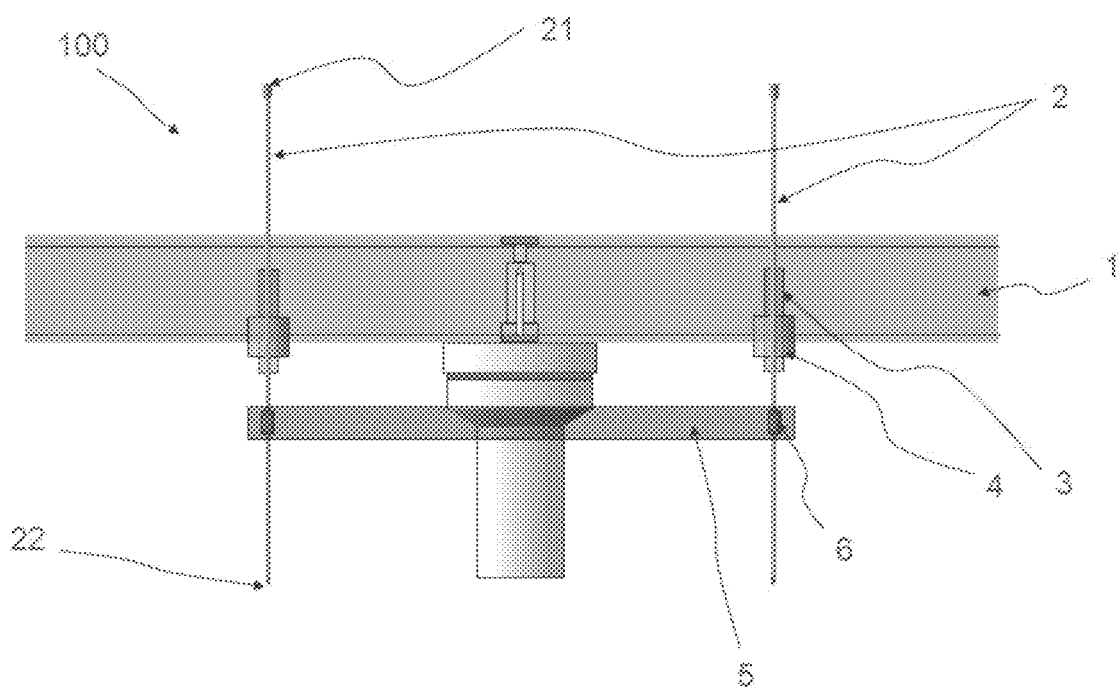
[FIG 1]

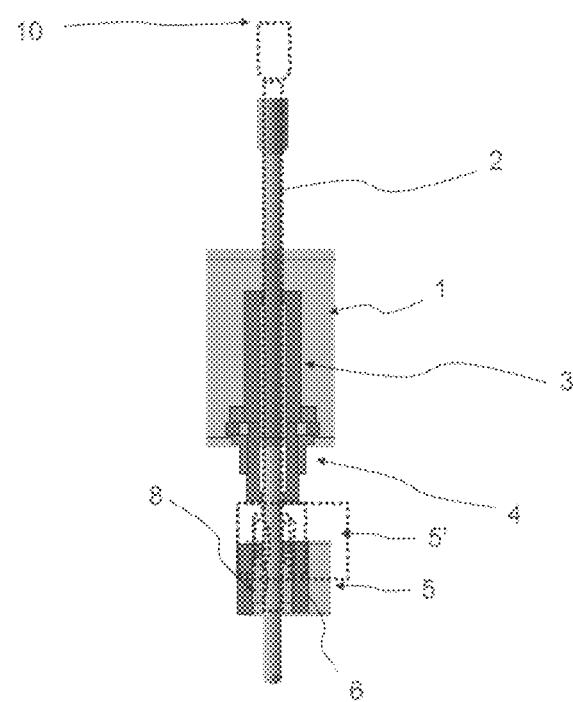
[FIG 2]

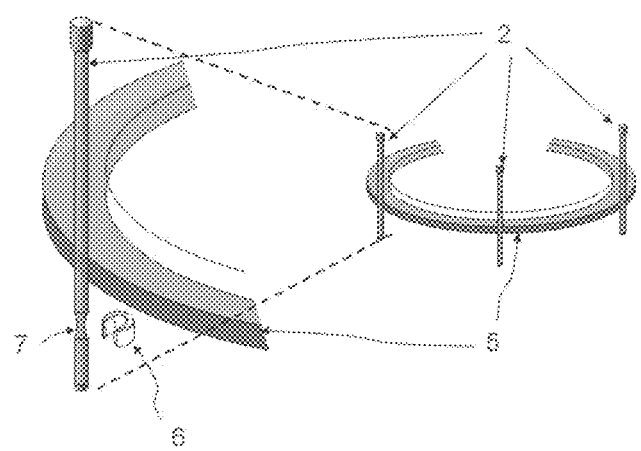
[FIG 3]

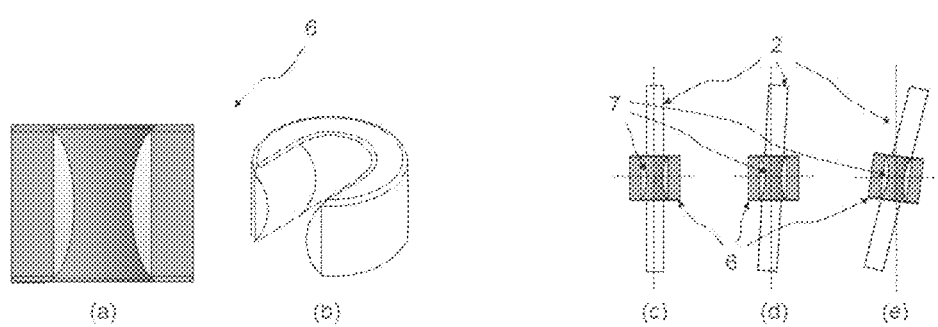
[FIG 4]

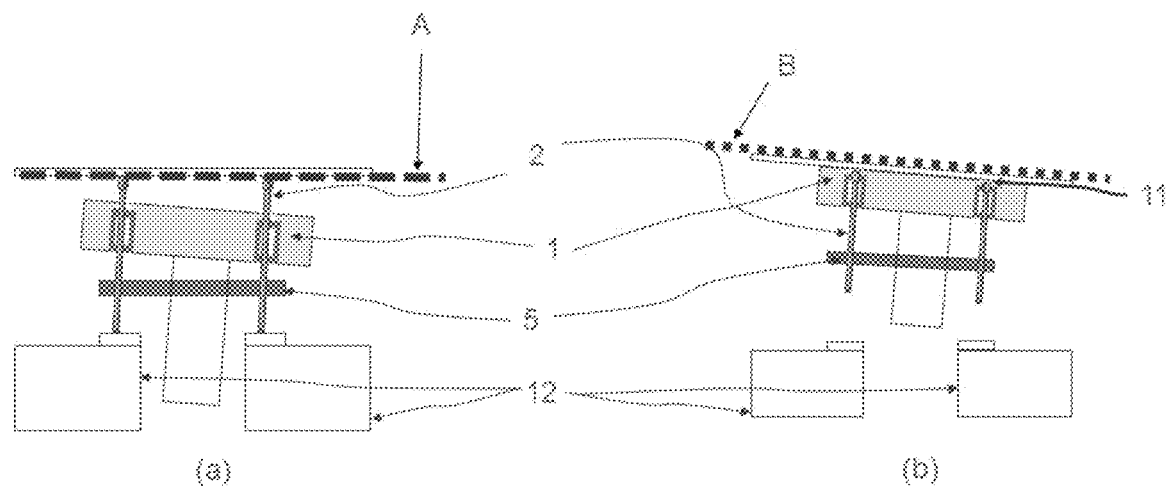
[FIG 5]

LIFT PIN ASSEMBLY

CROSS-REFERENCE TO RELATED APPLICATIONS

This application claims priority to U.S. Provisional Patent Application Ser. No. 63/289,377 filed Dec. 14, 2021 titled LIFT PIN ASSEMBLY, the disclosure of which is hereby incorporated by reference in its entirety.

BACKGROUND

1. Technical Field

The invention relates to apparatus for manipulating substrates and more particularly to an apparatus, i.e. lift pin, for lifting a substrate during processing in order to reduce the chance of getting caught by utilizing a ring shaped weight attached to the lift pin.

2. Description of the Related Arts

A conventional semiconductor wafer processing system contains one or more reactions between chemical precursors. Wafers are inserted into a reaction chamber during deposition process. The inserted wafers are placed between an upper electrode and a lower electrode within the reaction chamber, necessary processes are executed, and when completed, the wafers are to be recovered.

During the insertion and recovery, the wafers go through multiple lift pins placed in the lower electrode. Lift pins are not only operated independently but also supporting wafers. The lift pins are installed separately so the movements of each lift pin are not synchronized.

The wafers supported by lift pins are transferred to the process positions by movements of lower electrodes or heater blocks, and for making this kind of movement possible, lift pins may free fall due to gravity. Generally, lower electrodes maintain a flat and level state, but in special processes, they may be used in an inclined state. In the inclined state, the efficiency of wafer deposition may be improved. However, the inclined lower electrode causes difficulties for wafer insertion and return.

When the lower electrode is inclined, the lift pins installed in the lower electrode are also inclined. This minute inclination may cause some specific lift pins to stick in the lower electrode during the free fall.

To prevent this, a conventional method was devised. In this method, the weight of each lift pin is increased. This method may prevent the lift pins from getting stuck on the lower electrode when the lower electrode moves upward to be placed in the process position. Additional weight is attached to each lift pin's lower part to increase the lift pin's weight. However, the weight cannot be as much increased as desired due to the spatial constraints of the wafer processing chamber. Moreover, the lift pin's free fall may be hindered by the lift pin's additional weight when the electrode is inclined if lift pin has additional weight installed.

SUMMARY

The present disclosure provides an apparatus for manipulating substrates in semiconductor processing.

In one embodiment, a lift pin assembly for wafer processing comprising a plurality of lift pins, comprising a top end and a down end, and configured for the top end can move upward to an UP position and move downward to a DOWN position, wherein the top end supports a wafer, a weight comprising a plurality of lift pin holes and is configured to connect the plurality of lift pins and a plurality of weight supports, each of them are configured to attach to the plurality of lift pins respectively and each of them are to be placed in the plurality of lift pin holes respectively is presented.

In another embodiment, a lift pin assembly for wafer processing comprising a plurality of lift pins comprising a top end and a down end, a heating block configured to have multiple holes for the plurality of lift pins, and also configured to heat up a wafer, a weight configured to have a plurality of lift pin holes for the plurality of lift pins, and also configured to connect the plurality of lift pins and a plurality of weight supports, each of them are configured to attach to the plurality of lift pins respectively and each of them are placed in one of the lift pin holes is also presented.

The disclosure may have technical advantages of preventing the lift pins from getting stuck in the heating block when the lift pins are free falling.

The disclosure may have additional technical advantages of improving the efficiency of semiconductor processing by preventing the lift pins from getting stuck.

BRIEF DESCRIPTION OF THE DRAWINGS

FIG. 1. is an overview of a substrate processing apparatus with lift pins and ring-typed weight according to an embodiment of the present invention.

FIG. 2. is a magnified view of the lift pin placed in the heater block and depicts the maximum upward place of the lift pin according to an embodiment of the present invention.

FIG. 3. is a view of the lift pin and ring-typed weight attached to the lift pin with the weight support according to an embodiment of the present invention.

FIG. 4 is detailed views of the weight support according to an embodiment of the present invention. (a) is the front view, (b) is overview, (c) (e) are the inclination of the lift pin and the weight support according to an embodiment of the present invention.

FIG. 5 is overviews of the positions of the lift pins and weight when heater block is up (b)/down (a) according to an embodiment of the present invention.

DETAILED DESCRIPTION OF THE DISCLOSURE

In this specification, substrate and wafer have very similar or same meaning.

FIG. 1 shows a lift pin assembly 100 and a heater block 1 and lift pins 2 for manipulating a substrate. The lift pin assembly 100 includes a plurality of lift pins 2, the heating block 1, a bushing 3, a cap for bushing 4, weight 5 to which the lift pins 2 attach, and weight support 6. Lift pin 2 may be fabricated or made of ceramic, metal or reinforced plastic and comprises top end 21 and down end 22 on both ends and has a long pole shape.

The heating block 1 heats up the wafer when processing it and the bushing 3 secures a pass through space for the lift pin 2 in the heating block 1.

A cap for bushing 4 is a set up exit in the lower heating block 1 for the lift pin 2.

The weight support 6 locates in the weight 5's hole through which the lift pin 2 penetrates the weight 5 and the weight support 6 attaches to the lift pin 2 and supports the weight 5 so that weight 5 is connected to the lift pin 2 tightly and flexibly.

When weight 5 is connected to the lift pins 2, the total weight on the lift pin 2 increases. This increased total weight on lift pin 2 can prevent the lift pin 2 from getting stuck in the heating block 1.

FIG. 2 shows lift pin 2 in detail.

Lift pin 2 passes through and is placed in heater block 1 and weight 5, and is supported by weight support 6 which is placed in the lift pin hole 8 in the weight 5. Weight 5 may be a ring-type in its shape. FIG. 2 also shows that the movement range of lift pin 2 is restricted due to weight 5. As can be seen in FIG. 2, lift pin 2's upward position is UP position 10. That means lift pin 2 may move up and down and the maximum upward movement range is UP position 10. The weight 5 has more than one lift pin hole 8 for the lift pin to pass through it. Preferably, the number of lift pin holes in one (ring-shaped) weight is at least 3 and may vary due to the purpose and circumstance.

FIG. 3 shows weight 5 and weight support 6 in detail. Weight 5 has a multiple lift pin holes for the lift pins 2 and lift pin 2 has a concave surface 7 in a certain part of the lift pin 2 so that the weight support 6 can be attached to it. With the detailed lift pin 2, FIG. 3 shows the lift pin 2 goes through heater block 1 in detail. Lift pin 2 has 2 maximum positions. Those are an UP position 10 (in FIG. 2), which indicates the maximum upward position to which the lift pin can move up, and a DOWN position 11 (in FIG. 5), which indicates the maximum downward position to which the lift pin can move down. The weight 5, which is connected to the lift pin 2 in the concave surface 7, restricts the movement of the lift pin 2 as the lift pin 2 moves upward when the weight 5 gets in contact with the heater block 1 (UP position 10). The lift pin 2's top end may be thicker than the rest of it (see FIG. 2) such that the lift pin 2 cannot go below the bush for the lift pin 3 in the heater block 1. The maximum downward position for the lift pin 2 can be the DOWN position 11 (FIG. 5).

FIG. 4 depicts weight support 6 in detail. Weight support 6 may have convex inner surface with an open mouth, therefore U-shaped (FIG. 4 (b)). Weight support 6 may have a convex curved inner surface so that it can be attached to the lift pin 2's concave surface 7 tightly. The lift pin 2's movement upward/downward won't disconnect the lift pin 2 from weight 5 due to the tight attachment.

The weight support 6's convex curved inner surface and the lift pin 2's concave curve surface also may provide flexibility to the movements of lift pin 2 and weight 5 and weight support 6 respectively.

FIG. 4(c)-(e) show the relative movements of lift pin 2 and weight support 6 in the lift pin hole 8 of weight 5 (weight 5 is not drawn). FIG. 4(c) shows there is no movement of lift pin 2. FIG. 4(d) shows lift pin 2's sidewise movement. Due to the slack (gap) between the lift pin 2 and weight support 6, small sidewise movement of lift pin 2 does not affect the weight support 6 in the lift pin hole 8 so only the lift pin 2 would move sidewise. A strong sidewise movement of lift pin 2 would affect the weight support 6 and forces it move a little. (FIG. 4(e)) However, the movement of weight support 6 is quite smaller than that of lift pin 2 due to the space slack (gap) derived from the lift pin 2's concave curve surface 7 and the weight support 6's convex curved inner surface. That means weight 5 would not move as much as the lift pin 2 moves.

FIG. 5 shows lift pin 2's movement in accordance with the heater block 1's movement. If separate weights are to be attached to the respective lift pins 2, then it might be possible that each lift pin 2 would move in different directions due to the separate weight when heater block 1 is inclined. (Not illustrated) But, according to an embodiment of the present invention in FIG. 5, when the lift pins 2 are connected with a weight 5 of ring shape, the movements of the lift pins 2 may be synchronized.

Weight 5 may be supported by the weight support 6 attached to the lift pin 2. However, the positions of lift pin 2 can vary according to the position of heater block 1. In case of heater down (FIG. 5(a)), the relative vertical positions of all lift pins 2's top ends are same because the lift pins 2 are supported by decks (or pedestals) 12 (dotted line A). However, in case of heater up (FIG. 5(b)), the relative vertical positions of all lift pins 2's top ends are determined by the inclination degree of the heater block 1 (dotted line B).

If heater block 1 is inclined, each lift pin 2 is also inclined due to the heater block 1's inclination therefore the relative vertical positions are different. (FIGS. 5A & B)

And the state of heater block 1 (whether it is UP or DOWN) would decide the movement of the weight 5 supported by lift pins 2 and weight support 6. But lift pin 2's concave curve surface 7 and weight support 6's convex curved inner surface may contact with each other in a curved surface. Therefore, the weight 5 can move somewhat independently of the states and positions of heater block 1 and lift pins 2.

As shown, according to an embodiment of the present invention, the lift pin 2's free fall is not hindered and not stuck and the ring shape (ring-type) weight 5 supported by weight support 6 to be attached to the lift pins 2, such that the weight 5 may move somewhat independently of the position and movement of lift pins 2.

The embodiments provide an apparatus which prevents the lift pins from getting stuck while free falling and therefore improving the efficiency of semiconductor processing.

The above-described arrangements of apparatus methods are merely illustrative of applications of the principles of this invention and many other embodiments and modifications may be made without departing from the spirit and scope of the invention as defined in the claims. Other shapes of weight support to support the weight to be connected to the lift pin may be employed. The scope of the invention should therefore, be determined not with reference to the above description, but instead should be determined with reference to the appended claims along with their full scope of equivalents.

What is claimed:

1. A lift pin assembly for wafer processing, comprising:
   a plurality of lift pins, comprising a top end and a down end, and configured for the top end can move upward to an UP position and move downward to a DOWN position, wherein the top end supports a wafer;
   a weight comprising a plurality of lift pin holes and is configured to connect the plurality of lift pins;
   a plurality of weight supports, each of them are configured to attach to the plurality of lift pins respectively and each of them are to be placed in the plurality of lift pin holes respectively;
   a bushing configured to secure a pass through space for the lift pin in a heating block; and
   a cap for the bushing configured as a set up exit in the lower heating block for the lift pin.

2. The lift pin assembly of claim 1,
   wherein the plurality of lift pins are configured to have a concave curvature to accommodate the weight support.

3. The lift pin assembly of claim 2,
wherein the plurality of weight supports have a convex curved inner surface.

4. The lift pin assembly of claim 1,
wherein the plurality of weight supports are made from at least one of: ceramic, metal, or reinforced plastic.

5. The lift pin assembly of claim 3,
wherein movements of the plurality of lift pins are flexible due to the shape of the plurality of weight supports.

6. The lift pin assembly of claim 1,
wherein the plurality of lift pins can move upward and downward in the plurality of lift pin holes.

7. The lift pin assembly of claim 1,
wherein the number of the plurality of lift pin holes is at least 3.

8. The lift pin assembly of claim 1,
wherein the shape of the weight is ring-shaped.

9. A lift pin assembly for wafer processing, the assembly comprising,
a plurality of lift pins comprising a top end and a down end;
a heating block configured to have multiple holes for the plurality of lift pins, and also configured to heat up a wafer;
a weight configured to have a plurality of lift pin holes for the plurality of lift pins, and also configured to connect the plurality of lift pins;
a plurality of weight supports, each of them are configured to attach to the plurality of lift pins respectively and each of them are placed in one of the lift pin holes;
a bushing configured to secure a pass through space for the lift pin in the heating block; and
a cap for the bushing configured as a set up exit in the lower heating block for the lift pin.

10. The lift pin assembly of claim 9,
wherein the plurality of lift pins are configured to have a concave curvature to accommodate the weight support.

11. The lift pin assembly of claim 10,
wherein the plurality of weight supports have a convex curved inner surface.

12. The lift pin assembly of claim 11,
wherein the movements of the plurality of lift pins are flexible due to the shape of the plurality of weight supports.

13. The lift pin assembly of claim 10,
wherein the plurality of weight supports are made from at least one of: ceramic, metal, or reinforced plastic.

14. The lift pin assembly of claim 9,
wherein the plurality of lift pins can move upward and downward in the plurality of lift pin holes.

15. The lift pin assembly of claim 9,
wherein the number of the plurality of lift pin holes is at least 3.

16. The lift pin assembly of claim 9,
wherein the shape of the weight is ring-shaped.

17. The lift pin assembly of claim 9,
wherein the heating block is configured to be placed upside of the weight.

* * * * *